United States Patent [19]

Yoo

[11] Patent Number: 6,067,248

[45] Date of Patent: May 23, 2000

[54] NONVOLATILE SEMICONDUCTOR MEMORY WITH SINGLE-BIT AND MULTI-BIT MODES OF OPERATION AND METHOD FOR PERFORMING PROGRAMMING AND READING OPERATIONS THEREIN

[75] Inventor: Tae-Hwa Yoo, Kyunggi-do, Rep. of Korea

[73] Assignee: Samsung Electronics, Co., Ltd., Suwon, Rep. of Korea

[21] Appl. No.: 09/290,724

[22] Filed: Apr. 12, 1999

[30] Foreign Application Priority Data

Apr. 10, 1998 [KR] Rep. of Korea .................. 98-12826

[51] Int. Cl.[7] .................................. G11C 16/00
[52] U.S. Cl. ........................ 365/185.03; 365/185.09
[58] Field of Search ...................... 365/185.03, 185.09, 365/185.11, 200

[56] References Cited

U.S. PATENT DOCUMENTS

| | | | |
|---|---|---|---|
| 5,671,178 | 9/1997 | Park et al. | 365/185.09 |
| 5,838,610 | 11/1998 | Hashimoto | 365/185.03 |
| 5,966,326 | 10/1999 | Park et al. | 365/185.03 |
| 5,982,663 | 11/1999 | Park | 365/185.09 |

*Primary Examiner*—Tan T. Nguyen
*Attorney, Agent, or Firm*—Marger Johnson & McCollom, P.C.

[57] ABSTRACT

A nonvolatile memory having a memory field and a redundant field within a single semiconductor chip is disclosed. The memory field is provided to store normal data and the redundant field is provided to store essential device data. The nonvolatile memory includes a plurality of first page buffers performing a multi-bit reading operation for the memory field and a plurality of second page buffers performing a regular single-bit operation for the redundant field. A time period of the regular single-bit operation for the redundant field is shorter than that of the multi-bit operation for the memory field. The nonvolatile semiconductor memory of the invention is therefore capable of performing single-bit operation at a higher speed than the conventional nonvolatile semiconductor memories each having the single- and multi-bit operation modes, improving their performance.

4 Claims, 6 Drawing Sheets

NONVOLATILE SEMICONDUCTOR MEMORY WITH SINGLE-BIT AND MULTI-BIT MODES OF OPERATION AND METHOD FOR PERFORMING PROGRAMMING AND READING OPERATIONS THEREIN

FIELD OF THE INVENTION

The present invention relates to nonvolatile semiconductor memories and more particularly to a flash Electrically Erasable and Programmable Read Only Memory (EEPROM) which employs both single-bit and multi-bit memory cell arrays. This invention also relates to a method of performing data operations within a flash EEPROM.

BACKGROUND OF THE INVENTION

Flash EEPROM devices typically include a semiconductor substrate of first conductivity type (e.g., P-type), spaced source and drain regions of second conductivity (e.g., N-type) in the substrate, a channel region at a face of the substrate, between the spaced source and drain regions, a floating gate for storing charge carriers when the device is programmed and a control gate which overlies the floating gate, opposite the channel region.

Operations of such flash EEPROM devices are typically classified into three modes, i.e., programming, erasing and reading.

Regular programming of a flash EEPROM is typically achieved by biasing the drain region of a selected memory cell transistor to a first positive bias (e.g., 5–6 V) relative to the source region thereof, and biasing the control gate thereof to a second positive bias (e.g., 8–12 V) which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then traps the hot electrons and accumulates them. Fortunately, the process of charging the floating gate is self-limiting. The negative charge accumulates on the floating gate, which in turn reduces the strength of the electric field in the tunneling oxide layer to the point where it is no longer capable of accelerating "hot" electrons from the drain side of the channel region. As will be understood by those skilled in the art, the accumulation of a large quantity of trapped electrons on the floating gate will cause the effective threshold voltage $V_{th}$ of the field effect transistor to increase (e.g., up to about 6–7 V). If this increase is sufficiently large, the field effect transistor will remain in a nonconductive "off" state when a predetermine "read" voltage $V_{read}$ (e.g., 4–5 V) is applied to the control gate during a regular reading operation because $V_{th}$ is greater than $V_{read}$. In this state, known as the programmed state, the EEPROM cell May be said to be storing a logic "0", or be called an "off-cell". Once programmed the EEPROM cell remains in its higher threshold voltage even when it power supply is interrupted or tuned off for long periods of time.

Erasing the EEPROM cell is to remove the charge accumulated in its floating gate. The erase operation of the cell can be carried out, for example, by applying a negative bias (e.g., about −10 V) to its control gate, and a third positive bias (e.g., 5–6 V) to its bulk, having its source and drain floated. This causes cold electron tunneling (i.e., Fowler-Nordheim tunneling) through the thin insulation (e.g., below 100 A) between the floating gate and the bulk, leading to a decrease in the threshold voltage of the EEPROM cell (e.g., 1–3 V). The erase voltages may be applied to the cell until it is erased below a maximum threshold voltage acceptable. Accordingly, if a flash cell has been erased, it will conduct heavily. In this case, the cell may be said to be storing a logic "1", or be called an "on-cell". Thus, by monitoring the bit line current, the programmed or erased state (i.e., 1 or 0) of the cell can be determined.

Regular reading of the EEPROM cell is achieved by applying the read voltage $V_{read}$ to the control gate, typically via a word line connecting a row of identical EEPROM cells, and applying a fourth positive bias (about 1 V) to the drain region, typically via a bit line connecting a column of identical EEPROM cells. If the EEPROM cell is programmed, it will not conduct drain current $I_{dc}$. If, however, the EEPROM cell has not been programmed (or has been erased), it will conduct heavily. By monitoring the bit line current, thus, the programmed state (i.e., 1 or 0) of the EEPROM cell can be determined.

Because of their advance performance characteristics, including higher programming speeds and lower power consumption, high density flash memories have recently proven useful as mass storage devices (or storage media) for portable electronic devices (such as digital still cameras and memory cards) and hard disks in personal computers, among other things.

Industry desires for more efficient integration density in a flash memory and for expanded memory capacity have led to the development of multi-bit (also known as multi-level, multi-state, or multiple bit) technology, wherein a plurality of bits are stored within a single memory cell. By providing for the storage of multiple bits within each memory cell, multi-bit technology contributes to a reduction in the cost-per-bit of data storage in flash memories that employ this technology. One prior art multi-bit configuration is disclosed on pp. 132–133 of the ISSCC Digest of Technical Papers dated Feb. 1995, in an article entitled "A Multilevel-Cell 32Mb Flash Memory", written by M. Bauer, et al. Specifically, this article discloses a cell array arranged in the NOR-type, in which a memory cell uses two bits to store one of four data states, i.e., "00", "01", "10", and "11". (As well-known to those skilled in the art, flash memories are classified into two types, namely, a "NAND-type" and a "NOR-type", in accordance with the logical configuration of the memory cells within the memory.) Each of these four states corresponds to a unique voltage level, e.g., "00"=2.5V, "01"=1.5V, "10"=0.5V, and "11"=−3V. These voltage levels are threshold values assigned to allow data to be read from memory cell having one of these four states of data stored therein. Significantly, the memory cell contains a distribution profiled corresponding to these various threshold values. Furthermore, memory cells coupled to a single word line can have threshold voltages that differ from each other.

To detect the data state of multi-bit memory cell, a read voltage having a voltage level between two threshold voltage levels, or on a lower or higher side of a threshold voltage, must be applied to a gate of each of the memory cells through a word line coupled thereto. Unfortunately, the width between adjacent threshold voltages (hereinafter referred to as a "window") is less than that found in a regular single-bit flash memory. For example, the window in a four-state flash memory is about 0.6V. Furthermore, when a word line voltage for performing a reading operation is located in a window of about 0.6V, the margin between an edge of the threshold voltage profiled and the level of the word line voltage may not be more than approximately 0.3V (as opposed to about a 1.3V margin in a regular single-bit memory). Therefore, when multi-bit flash memories are made using a manufacturing process subject to variations, or when they are influenced by variations in word line voltage level and temperature, the probability of having invalid sensing operations becomes significant.

This weak immunity against variations in external conditions suggests that the utility of the multi-bit flash memories as a storage device is limited to the storage of mass information, such as audio data, for example, where the failure to store even several data bits does not significantly disturb the organization of the information as a whole. Until now, therefore, regular single-bit flash memories have been used for storing information where reliability and stability of data storage are important, such as in the Basic Input/Output System (BIOS) or for font storage.

Recently, the present applicant has proposed a new flash memory which is disclosed in a prior U.S. patent application Ser. No. 09/010,430 entitled "NON-VOLATILE SEMI-CONDUCTOR MEMORY PERFORMING SINGLE-BIT AND MULTI-BIT OPERATIONS", filed Jan. 21, 1998, and issued as U.S. Pat. No. 5,982,663. Briefly, according to the disclosed flash memory, a cell array region is classified into two portions: a main memory area containing a multiplicity of memory fields, and a device data storage area containing a multiplicity of redundant fields respectively corresponding to the memory fields. In the conventional flash memory, multi-bit operations are carried out with respect to the memory fields, while single-bit operations are performed with respect to the redundant fields. Such a flash memory cell array architecture and its peripheral components are illustrated in FIG. 1.

Figure 1:
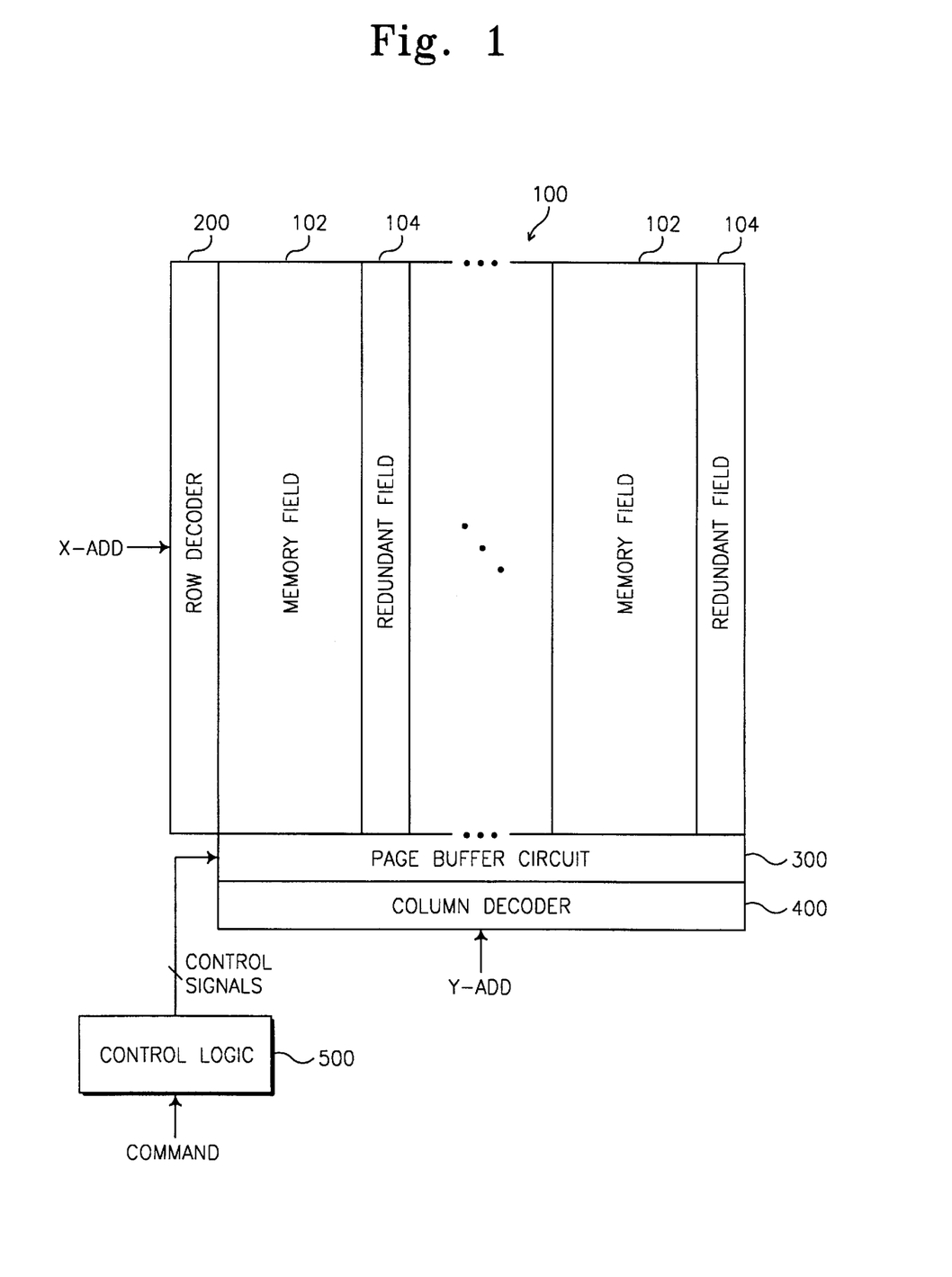
FIG. 1 is a block diagram illustrating a nonvolatile semiconductor memory with single- and multi-bit modes of operation, upon which the embodiments of the present invention can be implemented.

Referring to FIG. 1, the flash memory is provided with a memory cell array 100 which includes multiple memory fields 102 for storing normal data, and multiple redundant fields 104 for storing device data such as the addresses of bad portions of normal memory cell arrays and the status of address mapping. Because the data stored in the redundant field 104 is extremely important for determining whether an access operation of the memory data is either valid or invalid, the redundant field 104 should be located in a stable single-bit retention environment, rather than in an unstable multi-bit retention area, in order to guarantee data stability.

The flash memory also comprises row and column decoders 200 and 400 which select appropriate word lines and bit lines of the memory cell array 100, using row address signals X-ADD and column address signals Y-ADD, respectively. A page buffer circuit 300 is provided to program and read data to and from the memory cell array 100. A control logic 500 is further provided for the flash memory. The control logic 500 supplies several control signals of the page buffer circuit 300 depending on externally applied commands, so as to control operation modes of the page buffer circuit 300.

Figure 2:
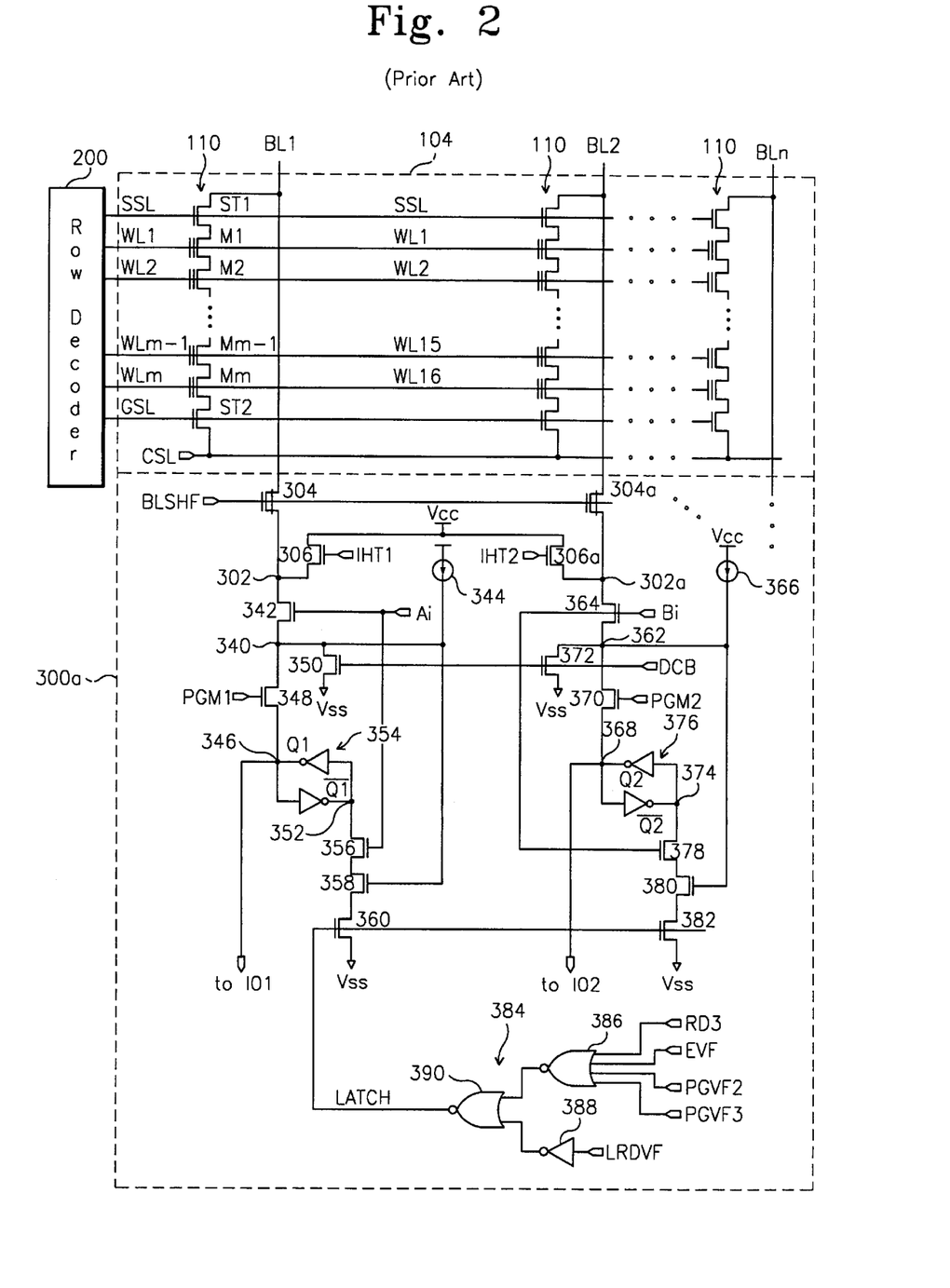
FIG. 2 is a circuit diagram illustrating a redundant field and its associated page buffer in a conventional nonvolatile semiconductor memory.

FIG. 2 shows a conventional architecture of the redundant field 104, and of an associated page buffer circuit 300a. Referring to FIG. 2, each redundant field 104 comprises a plurality of strings 110. Each of the strings 110 is organized having two string selection transistors, ST1 and ST2, and a plurality of memory cells M1 through Mm. Each string is further coupled to a corresponding one of the bit lines BL1 to BLn.

In the page buffer circuit 300a, a bit line BL1 is connected to a node 340 through an NMOS depletion transistor 304 and an NMOS transistor 342. Another bit line BL2 is connected to a node 362 through an NMOS depletion transistor 304a and an NMOS transistor 364. Gates of both the NMOS depletion transistors 304 and 304a are coupled in common to a bit line shielding signal BLSHF. A gate of the NMOS transistor 342 is coupled to a column address signal Ai. Additionally, an NMOS transistor 306 has a gate coupled to a first inhibition signal IHT1, and is connected between a power source voltage Vcc and a node 302. This node 302 is located between the transistors 342 and 304. Between the power source voltage Vcc and a node 302a, another NMOS transistor 306a is connected. The transistor 306a has its gate coupled to a second inhibition signal IHT2. The node 302a is interposed between the transistors 364 and 304a.

Another NMOS transistor 350, having a gate coupled to a bit line discharge signal DCB, is connected between the node 340 and the ground Vss. Similarly, an NMOS transistor 372 has a gate coupled to the bit line discharge signal DCB, and is connected between the node 362 and the ground Vss. Constant current is supplied to the node 340 from the power source voltage through a first independent current source 344. Constant current is also supplied to the node 362 from the power source voltage through a second independent current source 366.

The node 340 is connected to a first terminal Q1 of a first data latch 354 through an NMOS transistor 348, whose gate is coupled to a first programming signal PGM1. The terminal Q1 is also connected to a first input/output line IO1. A complementary first terminal $\overline{Q1}$ is connected to the ground Vss through NMOS transistors 356, 358 and 360, respectively. A gate of the transistor 356 is coupled to the address signal Ai, while a gate of the transistor 358 is connected to the node 340, and a gate of the transistor 360 is coupled to a latch signal LATCH. The node 362 is connected to a second terminal Q2 of a second data latch 376 through an NMOS transistor 370 whose gate is coupled to a second programming signal PGM2. The second terminal Q2 is also connected to a second input/output line IO2. A complementary second terminal $\overline{Q2}$ is connected to the ground Vss through NMOS transistors 378, 380, and 382, respectively. A gate of the transistor 378 is coupled of another column address signal Bi, while a gate of the transistor 380 is connected to the node 362, and a gate of the transistor 382 is coupled to the latch signal LATCH. The latch signal LATCH is provided to activate the data latches 354 and 376, respectively, and is generated by a NOR gate 390 of a latch control circuit 384.

Figure 3:
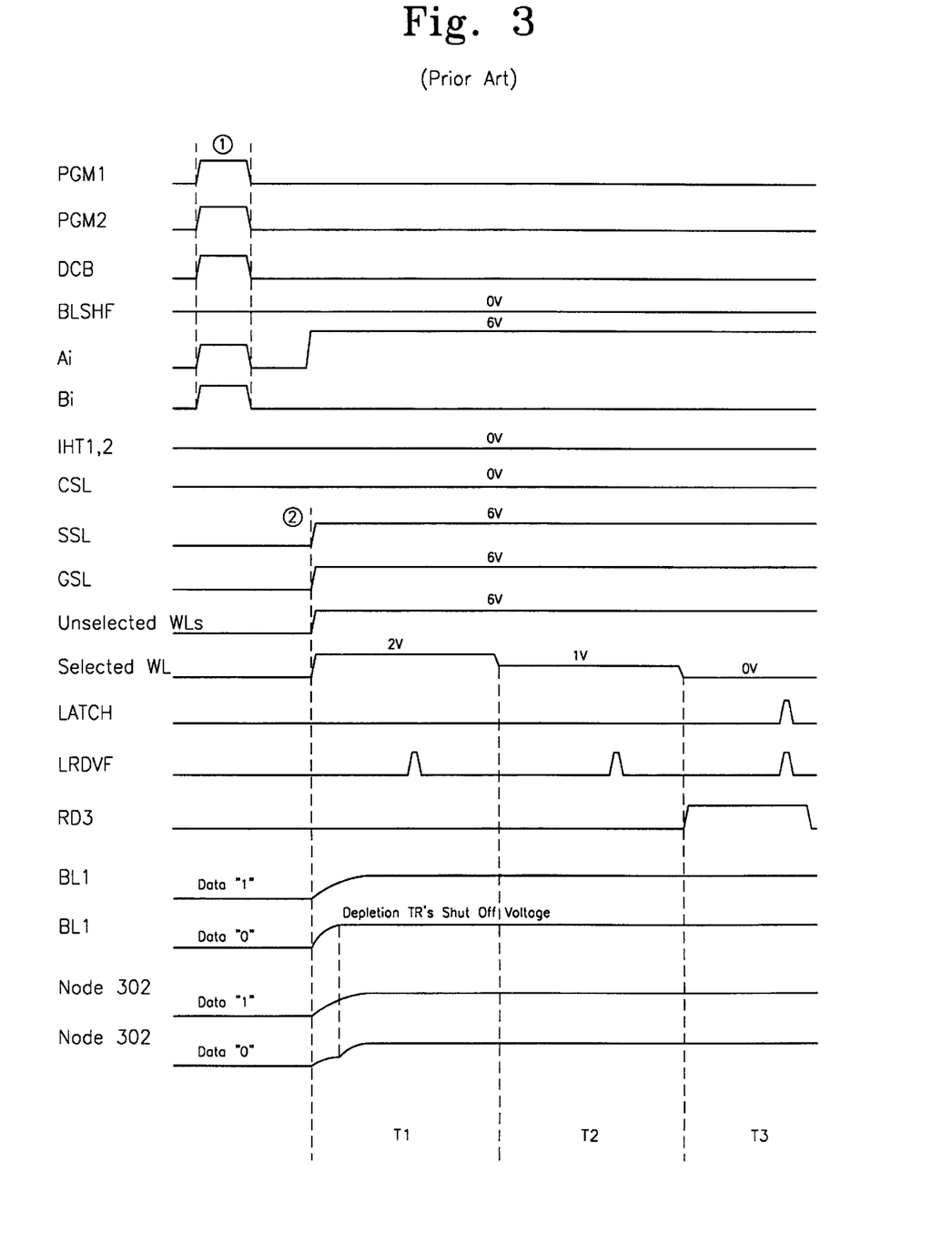
FIG. 3 is a timing diagram illustrating the timing for a single-bit reading operation associated with the redundant field of FIG. 2.

The latch control circuit 384 is supplied with several control signals RD3, EVF, PGVF2 and PGVF3 from control logic 500 of FIG. 1. The control signals RD3, EVF, PGVF2 and PGVF3 are applied as separate inputs to another NOR gate 386. An output of the NOR gate 386 is applied as a first input to the NOR gate 390, while an inverse of the read verification signal LRDVF is applied to the NOR gate 390 as a second input. FIG. 3 is a timing diagram for a reading operation of the redundant field 104 shown in FIG. 2. With reference to FIG. 3, the redundant field 104 has a read step which is performed using the same timing as the multi-bit reading sequence for the normal memory cell array in the memory field 102. As well known to one skilled in the art, a typical multi-bit (i.e., four-bit) reading sequence for the normal memory cell array includes three cycles T1, T2, and T3, as shown in FIG. 3.

For a single-bit reading operation of the redundant field 104, three read voltages 2V, 1V and 0V are sequentially applied to a selected word line in order, like the multi-bit reading operation for the memory field 102. The read signal RD3, applied to the latch control circuit 384, substantially determines when the single-bit reading operation for the redundant field 104 will be conducted. In the conventional flash memory, the single-bit reading operation for the redundant field 104 is carried out only during the third cycle T3 of the multi-bit reading operation timing under the control of the read signal RD3. However, since the conventional flash memory uses the same timing for the single-bit operation as for the multi-bit operation, the single-bit reading time accordingly increases in proportion with increase of the data states (data bits) defined for a multi-bit operation.

Based on the above, it can be appreciated that there presently exist needs in the art for flash memory devices and for methods of reading device data stored therein which overcome the above-described disadvantages and shortcomings of the presently available devices and methods.

SUMMARY OF THE INVENTION

Accordingly, it is an object of the present invention of provide nonvolatile semiconductor memories with both single-bit and multi-bit modes of operation, which are capable of making significant gains in performance.

Another object of the present invention is to provide nonvolatile semiconductor memories with both single-bit and multi-bit modes, which are capable of performing single-bit operation at an improved speed, regardless of the data states per multi-bit cell.

Briefly, the objects of the present invention are obtained by a nonvolatile semiconductor memory with both single-bit and multi-bit modes, which has a novel page buffer circuit and a novel control logic. The page buffer circuit and control logic allow a single-bit programming or reading operation of the redundant field for storing device data to be performed in a timing sequence different from that of multi-bit programming or reading operation of the memory field for storing normal data.

In particular, the nonvolatile semiconductor memory of the invention includes a plurality of first page buffers performing a multi-bit programming or reading operation for the memory field and a plurality of second page buffers performing a regular single-bit programming or reading operation for the redundant field under the control of the control logic. This control logic makes the time period of the single-bit operation of the second page buffers shorter than that of the multi-bit operation of the first page buffers. Furthermore, the control logic inhibits the memory field from being accessed, by controlling the first page buffers during a single-bit programming operation, in order to protect it from being programmed.

Therefore, according to the present invention, nonvolatile semiconductor memories with both single- and multi-bit modes are capable of performing single-bit operation at a higher speed than the conventional nonvolatile semiconductor memories with the two modes, thereby improving their performance.

DETAILED DESCRIPTION OF THE PREFERRED EMBODIMENTS

Following is a detailed description of the preferred embodiments of this invention, made with reference to the appended drawings, as described above, in which like or similar reference characters designate like or similar parts throughout the drawings.

The present invention can be implemented in such a nonvolatile semiconductor memory having the same structure as the memory device shown in FIG. 1. With reference to FIG. 1 a nonvolatile semiconductor memory device, to which the inventive concept of the invention is applicable, is provided with a memory cell array 100 that includes multiple memoryfields 102 and multiple redundant fields (or spare fields) 104.

Each memory field 102 comprises a normal memory cell array and a redundant memory cell array. The normal memory cell array is used to store normal data. The redundant memory cell array can be substituted for bad portions of the normal memory cell array within a corresponding memory field.

Each redundant field 104 stores information concerning device formulation, such as the addresses of bad portions of normal memory cell arrays and the status of address mapping. As described in the earlier background section of this application, since the data stored in the redundant field 104 is very important for determining whether an access operation of the memory data is either valid or invalid, the redundant field 104 should be located in a stable single-bit retention environment, rather than in an unstable multi-bit retention area, in order to guarantee data stability.

The flash memory also comprises a row decoder 200, a page buffer circuit 300, a column decoder 400, and a control logic 500. The row decoder 200 selects appropriate row lines, including one or more word lines WL1 through Wln (see FIG. 5) and selection lines SSL and GSL (see FIG. 5), in response to the row address signals X-ADD. The column decoder 200 selects bit lines BL1 through BLn (see FIG. 5) in response to the column address signals Y-ADD. The page buffer circuit 300 programs and reads data to and from the memory cell array 100. The control logic 500 supplies a plurality of control signals to the page buffer circuit 300 in response to an externally applied command, such as a PROGRAM, ERASE, or READ command, so as to control the operation of the page buffer circuit 300. The control signals generated by the control logic 500 will be described in detail later.

Figure 4:
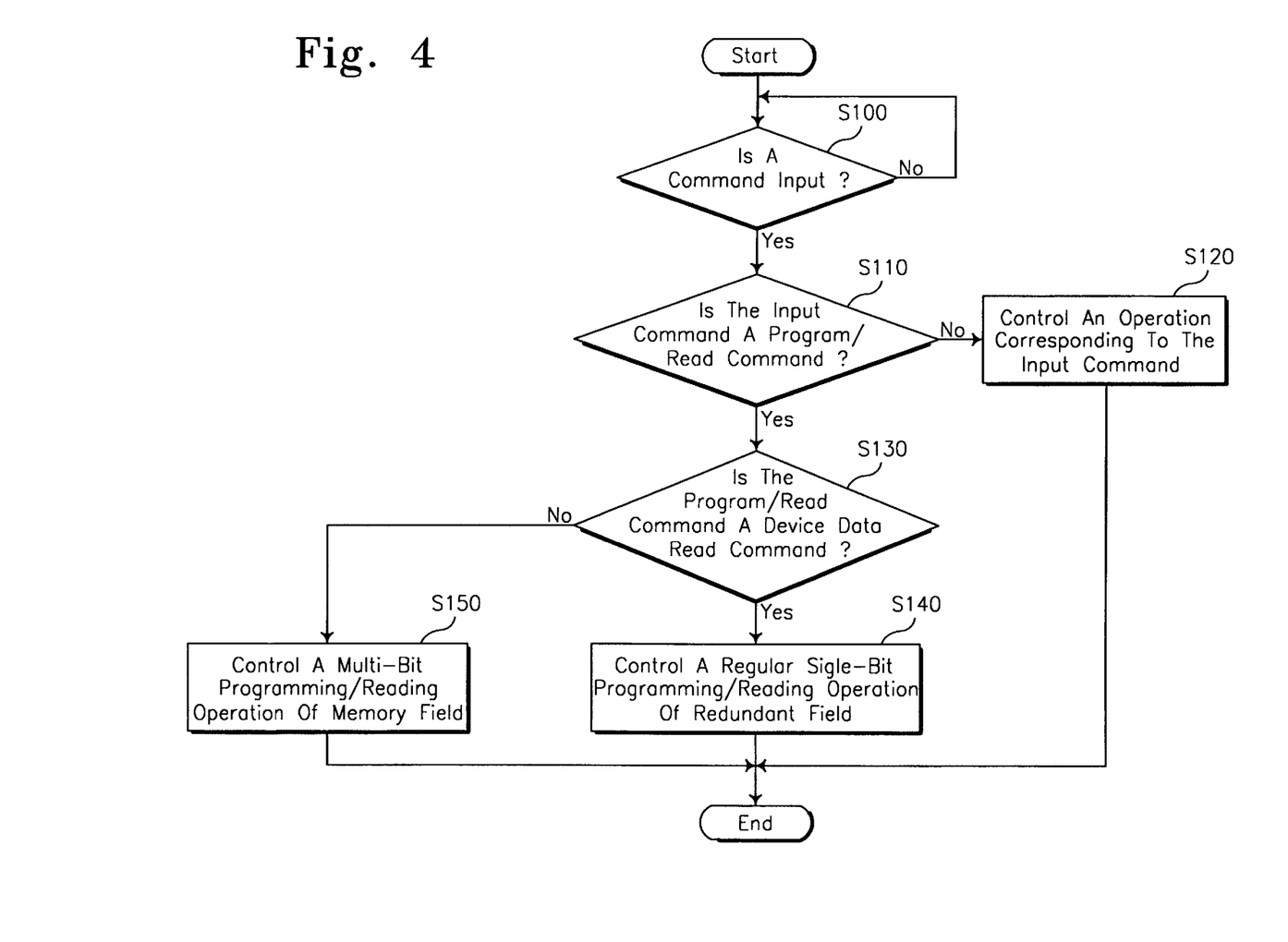
FIG. 4 a flowchart illustrating the command processing steps of a control logic embedded in a nonvolatile semiconductor memory according to the present invention.

FIG. 4 is a flowchart that illustrates the command processing steps of the control logic 500 according to the present invention.

From now, a method of performing an operation of a nonvolatile semiconductor memory according to the invention, which has both at least one multi-bit memory field 102 for storing normal data and at least one single-bit memory field 104 for storing device data, will be explained with reference to FIG. 4.

At step S100, it is determined whether a command is externally input. If so, control flow proceeds to the next query step S110, wherein it is asked whether the input command is a program or a read command. If not, flow proceeds to step S120 wherein the control logic 500 controls an operation corresponding to the input command, such as an erasing (including erase verifying) operation or a test operation.

In step S110, if the input command is identified as the program/read command, then flow advances to the next query step S 130, in which it is determined whether or not the program/read command is a device data program/read command associated with the redundant field 104. If so, flow continues to step S140, wherein the control logic 500 controls a regular single-bit programming or reading operation of the redundant field 104. In step S130, if not, the control logic 500 controls a multi-bit programming/reading operation associated with the memory field 102 in step S150.

It can be appreciated by those skilled in the art that a time period of the regular single-bit operation is shorter than that of a single-bit operation using the same timing as for a corresponding multi-bit operation. Thus, according to the invention, nonvolatile semiconductor memories with both single- and multi-bit modes of operation are capable of performing single-bit operation at an improved speed, thereby improving their performance.

Figure 5:
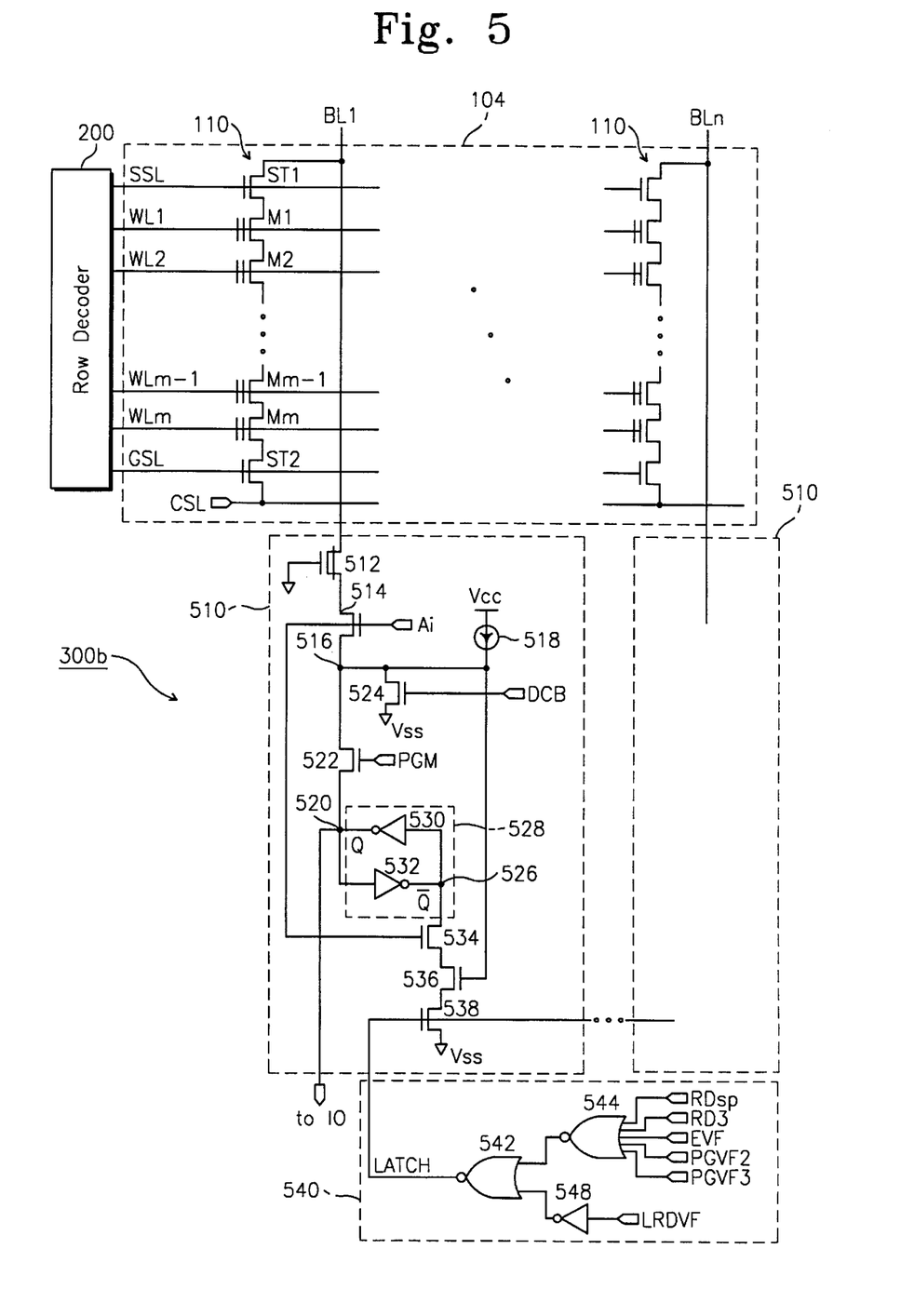
FIG. 5 is a circuit diagram illustrating a redundant field and its associated page buffer circuit in a nonvolatile semiconductor memory according to the present invention.

FIG. 5 illustrates circuit configurations of a redundant field 104 and its associated page buffer circuit 300b according to a preferred embodiment of the present invention. Referring to FIG. 5, the redundant field 104 comprises a plurality of strings 110 configured in a NAND-type flash memory arrangement. Each of the strings 110 is organized having two string selection transistors, ST1 and ST2, and a plurality of memory cells M1 through Mm. Each string 110 is further coupled to a corresponding one of the bit lines BL1 through BLn.

Specifically, in each string 110, the memory cells M1–Mm are serially connected between two string selection transistors ST1 and ST2. The first string selection transistor ST1 is coupled between the bit line BL1 and the first memory cell M1, while the second string selection transistor ST2 is coupled between the last memory cell Mm and a common source line CSL. A gate of the first string selection transistor ST1 is coupled to a string selection line SSL, while a gate of the second string selection transistor ST2 is connected to a ground selection line GSL. A gate of each of the memory cells M1 to Mm is coupled to a corresponding one of word lines WL1 through WLm. The string selection line SSL, ground selection line GSL, and word lines WL1–WLm are connected to outputs of the row decoder 200. The bit lines BL1 through BLn are coupled to the page buffer circuit 300b.

The page buffer circuit 300b comprises a plurality of page buffers 510 which are connected with the bit lines BL1 to BLn, respectively. Specifically, in each page buffer 510, the corresponding bit line (e.g., BL1) is connected to a node 516 through an NMOS depletion transistor 512 and an NMOS transistor 514. A gate of the NMOS depletion transistor 512 is grounded. A gate of the NMOS transistor 514 is coupled to a column address signal Ai. Constant current is supplied to the node 516 from a power voltage source Vcc through an independent current source 518.

Another NMOS transistor 524, having a gate coupled to a bit line discharge signal DCB, is connected between the node 516 and a ground voltage source Vss. The node 516 is connected to a terminal Q of a data latch 528, consisting of two cross-coupled CMOS inverters 530 and 532, through an NMOS transistor 522 whose gate is coupled to a programming signal PGM. The terminal Q (or a node 520) of the data latch 528 is also coupled with a corresponding input/output line IO. A complementary terminal $\overline{Q}$ (or a node 526) of the data latch 528 is connected to the ground voltage source Vss through NMOS transistors 534, 536 and 538. A gate of the transistor 534 is coupled to the address signal Ai, while a gate of the transistor 536 is connected to the node 516. A gate of the transistor 538 is coupled to a latch enable signal LATCH which is provided to activate the data latch 528 and is generated by a NOR gate 542 of a latch control circuit 540.

The latch control circuit 540 is supplied with a plurality of control signals, for example, a regular single-bit sensing enable signal RDsp, a read signal RD3, an erasure verification signal EVF, a first program verification signal PGVF2, a second program verification signal PGVF3, and a read verification signal LRDVF, from control logic 500 (see FIG. 1). The regular single-bit sensing enable signal RDsp determines the sensing cycle time period of a regular programming/reading operation regarding the reference field 104. The read signal RD3 defines the third read period of a multi-bit reading operation (refer to T3 in FIG. 3) and the EVF signal defines the read cycles for the erase verification. The PGVF2 and PGVF3 signals define the second and third program cycles of the multi-bit programming operation for the memory field 102, respectively. The LRDVF signal is a pulse signal which is generated whenever data sensing is completed in every read cycle of a multi-bit reading operation. These signals RDsp, RD3, EVF, PGVF2 and PGVF3 are applied as separate inputs to the other NOR gate 544 within the latch control circuit 540. An output of the NOR gate 544 is applied as a first input to the NOR gate 542, while an inverse of the read verification signal LRDVF is applied to the NOR gate 390 as its second input.

Figure 6:
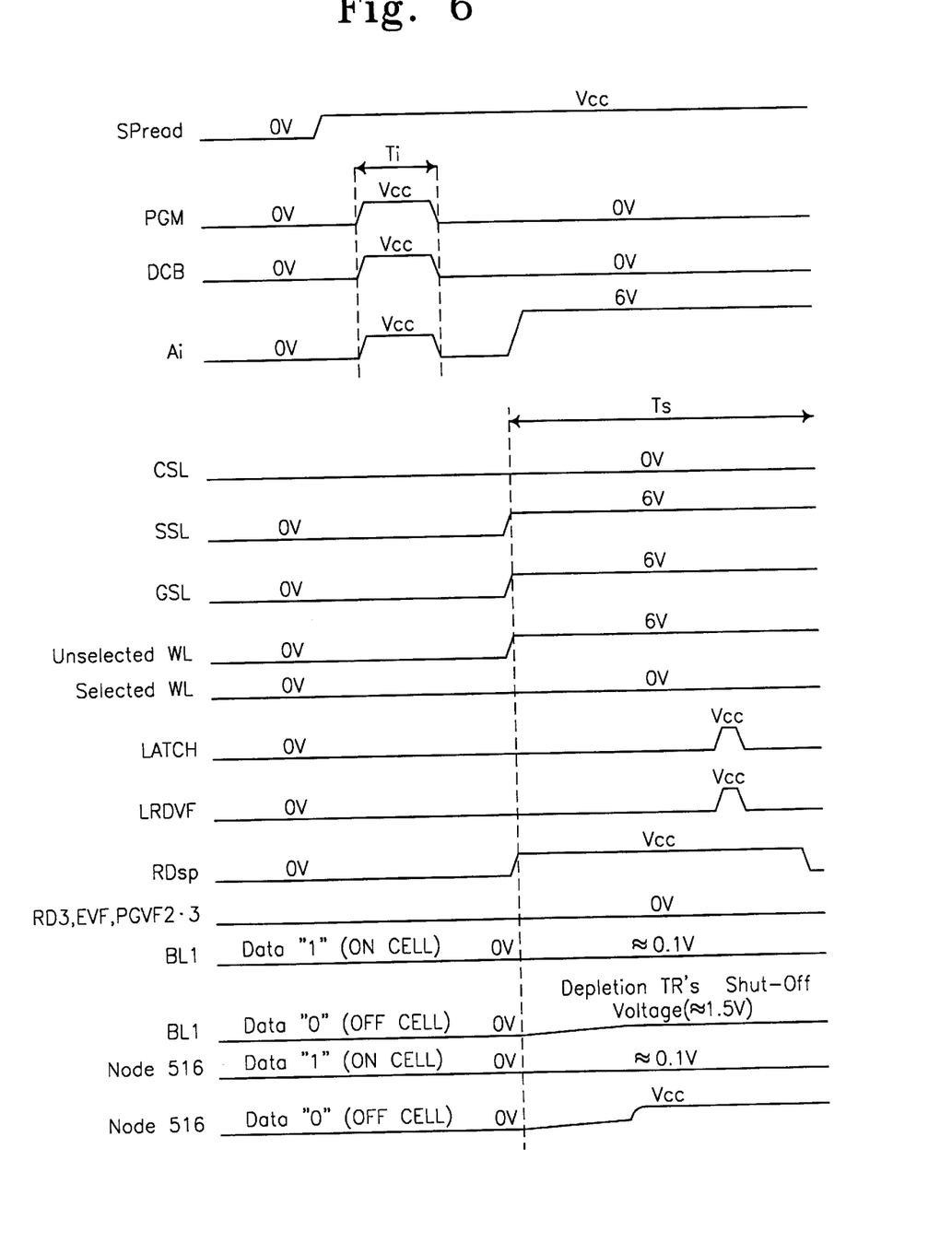
FIG. 6 is a timing diagram illustrating the timing for a novel signal-bit reading operation associated with the redundant field of FIG. 5.

FIG. 6 illustrates the timing of a novel single-bit reading operation for the redundant field 104 shown in FIG. 1 or 5. From now, a single-bit reading operation for the redundant field 104 (hereinafter, refer to a "regular" single-bit reading operation) will be described in detail with reference to FIGS. 5 and 6. As can be seen from the figures, the data read step of the redundant field 104 is performed using a regular single-bit operation that differs from the conventional single-bit operation for the redundant field 104 which uses the same timing as the multi-bit reading operation for the memory field 102 (refer to FIG. 3). A typical sequence of conventional single-bit (or multi-bit) programming or reading operation substantially includes more than three sensing (or read) cycles. For example, the reading operation for a memory cell, having four-bit storage capacity per cell such as the memory field 102, involves three cycles (see T1, T2 and T3 in FIG. 3).

Referring to FIG. 6, the flash memory of the present invention enters a regular single-bit reading operation mode for the redundant field 104 when a flag signal SPread goes high. Such a reading operation includes two periods, that is, an initialization period Ti and a data sensing period Ts.

During the initialization period Ti, the data latch 528 within each page buffer 510 is set and all the bit lines BL1–BLn are discharged to 0V because the signals PGM, DCB and Ai are developed to a high level (e.g., Vcc). This level renders the transistors 514, 522 and 524 conductive, so the node 520 (i.e., terminal Q of the data latch 528) becomes low (a data "1" state) together with the corresponding input/output line IO coupled to the node 520.

During the data sensing period Ts, only one read voltage of 0V (Vss) is applied to a selected word line, unlike that of the multi-bit reading operation, and the regular single-bit sensing enable signal RDsp becomes active (Vcc). It should be noted that the pulse duration of the signal RDsp (i.e., Ts) is never longer than any sensing cycle period in the conventional single bit reading operation using multi-bit timing sequence (e.g., T1, T2, or T3 in FIG. 3) discussed previously.

In such a regular sensing period Ts, the common source line CSL is applied with a voltage of 0V, while the unselected word lines, the ground select line GSL, and the source select line SSL are applied with a voltage of 6V. In this condition, if the bit line BL1 is selected, then the voltage level of the address signal Ai further rises up to 6V. This results in turning on the transistors 514 and 534 and turning off the transistors 522 and 524, so that the flash memory device enters its regular single-bit data sensing mode.

In case a selected memory cell, whose gate is applied with 0V, is a programmed on (i.e., an "off-cell" having its threshold voltage of, e.g., 1.3V) to store a data "0", then the current source 512 allows the selected bit line BL1 to be developed up to a shut-off voltage of the depletion transistor 512 (e.g., about 1.5V) and the node 516 to be charged up to Vcc level, rendering the transistor 536 conductive. In contrast, if the selected cell is an erased one (i.e., "on-cell" having its threshold voltage of, e.g., –2.7V) to store data "1", all the current from the current source 518 goes to the CSL line (i.e., Vss of 0V) through the transistors 514, 512, ST1, M1–Mm, and ST2. The transistor 536 is therefore tuned off since the bit line BL1 and the node 516 are maintained at 0V. This causes the data latch to remain in its set state, i.e., the data "1" state in which the terminals Q and $\overline{Q}$ remain low (0V) and high (Vcc), respectively.

Further, the regular single-bit sensing enable signal RDsp becomes active (Vcc), while the signals RD3, EVF, PGVF2 and PGVF3 are maintained inactive (0V), so the output of the NOR gate 544 remains low all through this period Ts. The read verification signal LRDVF is kept low until the completion of the regular single-bit data sensing, so that the latch enable signal LATCH remains low till that time.

After the completion of the regular single bit sensing, the read verification signal LRDVF is pulsed high, so that the latch enable signal LATCH is pulsed high too. This enables the data latch 528 to latch the sensed data on the selected bit line BL1. At this time, if the selected cell is an on-cell, then the data latch 528 still remains in its initial state (i.e., data "1" state) where the terminals Q (or the node 520) and $\overline{Q}$ (or the node 526) thereof are maintained low and high, respectively, because the transistor 536 is non-conductive. This has the result that the data latch 528 latches the sensed data "1". If, however, the selected cell is an "off-cell", the data retention state of the data latch 528 is reversed since the transistor 536 is conductive and the terminals Q (or the node 520) and $\overline{Q}$ (or the node 526) are maintained high and low, respectively. This gives the result that the sensed data "0" on the bit line BL1 is virtually latched by the data latch 528.

The regular single-bit reading operation of the present invention is terminated by deactivating the signals SPread and RDsp.

As described above, according to the present invention, nonvolatile semiconductor memories with both single- and multi-bit modes are capable of performing single-bit reading operation at a higher speed than the conventional memories because the time period of the regular single-bit reading operation for the redundant field is shorter than that of the conventional single-bit operation using the same multi-bit operation timing as for the memory field 102.

On the other hand, when a device data program/read command is issued, the control logic 500 of the invention controls a regular single-bit programming operation for the redundant field 104, similar to the regular single-bit reading operation. The cycle time period of the single-bit programming of the invention is not longer than any of more than three cycle periods of the convention single-bit programming operation using the same sequence as the multi-bit programming.

In this regular programming operation, the control logic 500 inhibits the memory field 102 from being accessed by controlling an associated page buffer circuit in order to protect the memory field 102 against being programmed because of the well-known page programming technique. Examples of such a page buffer circuit used for the memory field 102 and a single-bit programming method using the same timing sequence as the multi-bit operation are fully described, for example, in U.S. Pat. No. 5,862,074 to Park, entitled INTEGRATED CIRCUIT MEMORY DEVICES HAVING RECONFIGURABLE NONVOLATILE MULTI-BIT MEMORY CELLS THEREIN AND METHODS OF OPERATING SAME, assigned to the present applicant, the disclosures of which are hereby incorporated herein by reference.

The control logic 500 of the invention also controls the programming time period of the regular programming operation in response to the device data program command.

As described above, since the control logic 500 inhibits the memory field 102 from being programmed in the regular single-bit programming operation for the redundant field 104, nonvolatile semiconductor memories with both single- and multi-bit modes are capable of performing single-bit operations for the redundant fields 104 at a higher speed than the conventional memories performing a single-bit programming operation using the same timing sequence as the multi-bit programming operation, thereby improving their performance too.

While the present invention has been particularly disclosed with reference to the preferred embodiments thereof, it should be appreciated that many other embodiments and modifications of the invention will be apparent to those skilled in the art which fall within the spirit and scope of the following claims.

What is claimed is:

1. A nonvolatile semiconductor memory comprising:
   a nonvolatile memory cell array having a memory field which is used to store normal data, and a redundant field which is used to store device data on device formulation or address mapping;
   a page buffer circuit including a plurality of first page buffers coupled to the memory field and a plurality of second page buffers to the redundant field, the first page buffers performing a multi-bit operation for the memory field, and the second page buffers performing a single-bit operation for the redundant field; and
   a control logic for controlling the operations of the memory field and the redundant field,
   wherein the control logic makes a time period of the single-bit operation shorter than that of the multi-bit operation.

2. The memory of claim 1, wherein the redundant field comprises a plurality of strings configured in a NAND-type flash memory arrangement.

3. The memory of claim 1, wherein the page buffer circuit performs programming and reading operations for both the memory field and the redundant field.

4. A method for performing operations in a nonvolatile semiconductor memory having both a multi-bit memory field storing normal data and a single-bit memory field storing device data, the method comprising:

determining whether an input command is a device data program/read command or not;

performing a multi-bit programming/reading operation on the memory field when the input command is not the device program/read command; and performing a regular single-bit programming/reading operation on the single-bit memory field when the input command is the device program/read command, wherein the regular single-bit programming/reading operation has a time period shorter than that of the multi-bit programming/reading operation.

* * * * *

UNITED STATES PATENT AND TRADEMARK OFFICE
CERTIFICATE OF CORRECTION

PATENT NO.    : 6,067,248
DATED         : May 23, 2000
INVENTOR(S)   : Yoo

It is certified that error appears in the above-identified patent and that said Letters Patent is hereby corrected as shown below:

Column 1,
Line 66, "tuned off" should read -- turned off --.

Column 4,
Line 45, "coupled of" should read -- coupled to --.

Column 5,
Lines 12-13, "single-bit reading" should read -- single-bit operation does take the same time as the multi-bit operation; a further result is that reading --.

Column 9,
Line 27, "programmed on" should read -- programmed one --.
Line 37, "tuned off" should read -- turned off --.

Column 10,
Line 39, "single-bit operations" should read -- single-bit programming operations --.

Signed and Sealed this

Eighth Day of October, 2002

*Attest:*

*Attesting Officer*

JAMES E. ROGAN
*Director of the United States Patent and Trademark Office*